(12) United States Patent
Smith et al.

(10) Patent No.: US 12,052,392 B2
(45) Date of Patent: Jul. 30, 2024

(54) RESOLVING BAD AUDIO DURING CONFERENCE CALL

(71) Applicant: LENOVO (Singapore) PTE. LTD., New Tech Park (SG)

(72) Inventors: Joshua Smith, Milton, FL (US); Matthew Fardig, Boonville, IN (US); Tobias Christensen, San Francisco, CA (US); Sathish Kumar Ganesan, Morrisville, NC (US)

(73) Assignee: Lenovo (Singapore) Pte. Ltd., New Tech Park (SG)

(*) Notice: Subject to any disclaimer, the term of this patent is extended or adjusted under 35 U.S.C. 154(b) by 230 days.

(21) Appl. No.: 17/203,628

(22) Filed: Mar. 16, 2021

(65) Prior Publication Data

US 2022/0303393 A1  Sep. 22, 2022

(51) Int. Cl.
*H04M 3/00* (2024.01)
*G10L 25/60* (2013.01)
(Continued)

(52) U.S. Cl.
CPC ........... *H04M 3/568* (2013.01); *G10L 25/60* (2013.01); *H03G 5/025* (2013.01); *H03G 5/165* (2013.01)

(58) Field of Classification Search
CPC ...... H04M 3/568; H04M 3/56; H04M 3/2227; H04M 3/2236; H04M 3/42042; H04M 2203/352; H04M 2250/62; H04M 3/002; H04M 9/082; H04M 7/006; H04M 3/567; H04L 41/22; H04L 65/403; H04L 65/1069; H04L 41/5003; H04L 65/104; H04L 65/1093; H04L 65/1063; H04L 43/08; H04L 43/0817; H04L 41/509; H04L 12/1822; H04L 65/80; H04L 12/1827; H04L 65/1016; H04L 65/1089; H04L 41/5032; H04L 43/0829; H04L 43/16; G10L 21/0364; G10L 25/60; G10L 21/02; G10L 25/48; G10L 2021/02082; G10L 25/69; G10L 21/0208; G10L 21/057;
(Continued)

(56) References Cited

U.S. PATENT DOCUMENTS 9,031,828 B2 * 5/2015 Leydon ................. G06F 40/232
                                                      704/3
2006/0067500 A1 * 3/2006 Christofferson ........ H04M 3/56
                                                      379/202.01
(Continued)

*Primary Examiner* — Kharye Pope
(74) *Attorney, Agent, or Firm* — Kunzler Bean & Adamson

(57) ABSTRACT

For detecting and resolving bad audio during conferencing, methods, apparatus, and systems are disclosed. One apparatus includes a processor and a memory that stores code executable by the processor. The processor detects bad audio for a conference call, the conference call involving a plurality of participants. The processor switches a first input stream to an analysis mode, where the bad audio corresponds to a first one of a plurality of input streams, the first input stream associated with a first participant. The processor sends a conference output channel to the first participant while in the analysis mode and concurrently analyzes the first input stream using a plurality of audio tools while in the analysis mode. The processor returns the first input stream to a conferencing mode in response to resolving the bad audio.

20 Claims, 6 Drawing Sheets

(51) Int. Cl.
*H03G 5/02* (2006.01)
*H03G 5/16* (2006.01)
*H04L 12/66* (2006.01)
*H04M 3/56* (2006.01)
*H04M 5/00* (2006.01)

(58) Field of Classification Search
CPC ....... G10L 19/008; G06F 3/165; G06F 3/162; G06F 11/0709; G06F 11/0793; G06F 16/4393; G06F 11/321
USPC ......... 379/202.01, 158, 93.21; 370/352, 260, 370/356
See application file for complete search history.

(56) References Cited

U.S. PATENT DOCUMENTS

| | | | | |
|---|---|---|---|---|
| 2012/0082304 | A1* | 4/2012 | Byrne | H04L 1/205 379/202.01 |
| 2013/0250786 | A1* | 9/2013 | Balasaygun | H04L 41/5032 370/252 |
| 2014/0093059 | A1* | 4/2014 | Kanevsky | H04M 3/2227 379/202.01 |
| 2015/0154183 | A1* | 6/2015 | Kristjansson | H04N 7/15 704/E13.001 |
| 2015/0215365 | A1* | 7/2015 | Shaffer | H04L 43/04 370/252 |
| 2016/0065742 | A1* | 3/2016 | Nasir | H04M 3/56 |
| 2016/0255203 | A1* | 9/2016 | Kreiner | G10L 21/0364 379/202.01 |
| 2016/0306788 | A1* | 10/2016 | Avore | G06F 16/638 |
| 2016/0372107 | A1* | 12/2016 | Dow | G06F 16/685 |
| 2017/0187602 | A1* | 6/2017 | Pathela | G06F 11/0751 |
| 2017/0237851 | A1* | 8/2017 | Hassan | H04M 3/2227 370/252 |
| 2018/0048768 | A1* | 2/2018 | Spittle | H04M 3/568 |
| 2018/0124511 | A1* | 5/2018 | Woodrow | H04R 3/005 |
| 2021/0104253 | A1* | 4/2021 | Jolly | G10L 25/60 |
| 2021/0110812 | A1* | 4/2021 | Naylor-Teece | G10L 15/30 |
| 2021/0144191 | A1* | 5/2021 | Kahl | G10L 25/57 455/416 |
| 2022/0020386 | A1* | 1/2022 | Vanapalli | G10L 21/0208 |
| 2022/0060584 | A1* | 2/2022 | Bhosle | H04M 3/565 |
| 2022/0201248 | A1* | 6/2022 | Olivieri | H04M 3/568 |

* cited by examiner

RESOLVING BAD AUDIO DURING CONFERENCE CALL

FIELD

The subject matter disclosed herein relates to electronic communications and more particularly relates to detecting and resolving bad audio during conferencing.

BACKGROUND

Conferencing products today have limited ability to determine if audio is in a bad state. The user with bad audio can remain quiet, but then has no idea if the conditions causing the bad audio have improved.

BRIEF SUMMARY

An apparatus for detecting and resolving bad audio during conferencing is disclosed. A method and computer program product also perform the functions of the apparatus.

One apparatus for detecting and resolving bad audio during a conference call includes a processor and a memory that stores code executable by the processor. The processor detects bad audio for a conference call, the conference call involving a plurality of participants, each participant corresponding to one of a plurality of input streams. The processor switches a first input stream to an analysis mode, where the bad audio corresponds to a first one of the plurality of input streams, the first input stream associated with a first participant. The processor sends a conference output channel to the first participant while in the analysis mode, the conference output channel being mixed from the plurality of input streams, and concurrently analyzes the first input stream using a plurality of audio tools while in the analysis mode. The processor returns the first input stream to a conferencing mode in response to resolving the bad audio.

One method for detecting and resolving bad audio during a conference call includes detecting bad audio for a conference call, the conference call involving a plurality of participants, each participant corresponding to one of a plurality of input streams. The method includes switching a first input stream to an analysis mode, where the bad audio corresponds to a first one of the plurality of input streams, the first input stream associated with a first participant. The method includes sending a conference output channel to the first participant while in the analysis mode, the conference output channel being mixed from the plurality of input streams, and concurrently analyzing the first input stream using a plurality of audio tools while in the analysis mode. The method includes returning the first input stream to a conferencing mode in response to resolving the bad audio.

A program product comprising a computer readable storage medium that stores code executable by a processor, the executable code comprising code to detect bad audio for a conference call, the conference call involving a plurality of participants, each participant corresponding to one of a plurality of input streams; switch a first input stream to an analysis mode, where the bad audio corresponds to a first one of the plurality of input streams, the first input stream associated with a first participant; send a conference output channel to the first participant while in the analysis mode, the conference output channel being mixed from the plurality of input streams; analyze the first input stream using a plurality of audio tools concurrently while in the analysis mode; and return the first input stream to a conferencing mode in response to resolving the bad audio.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
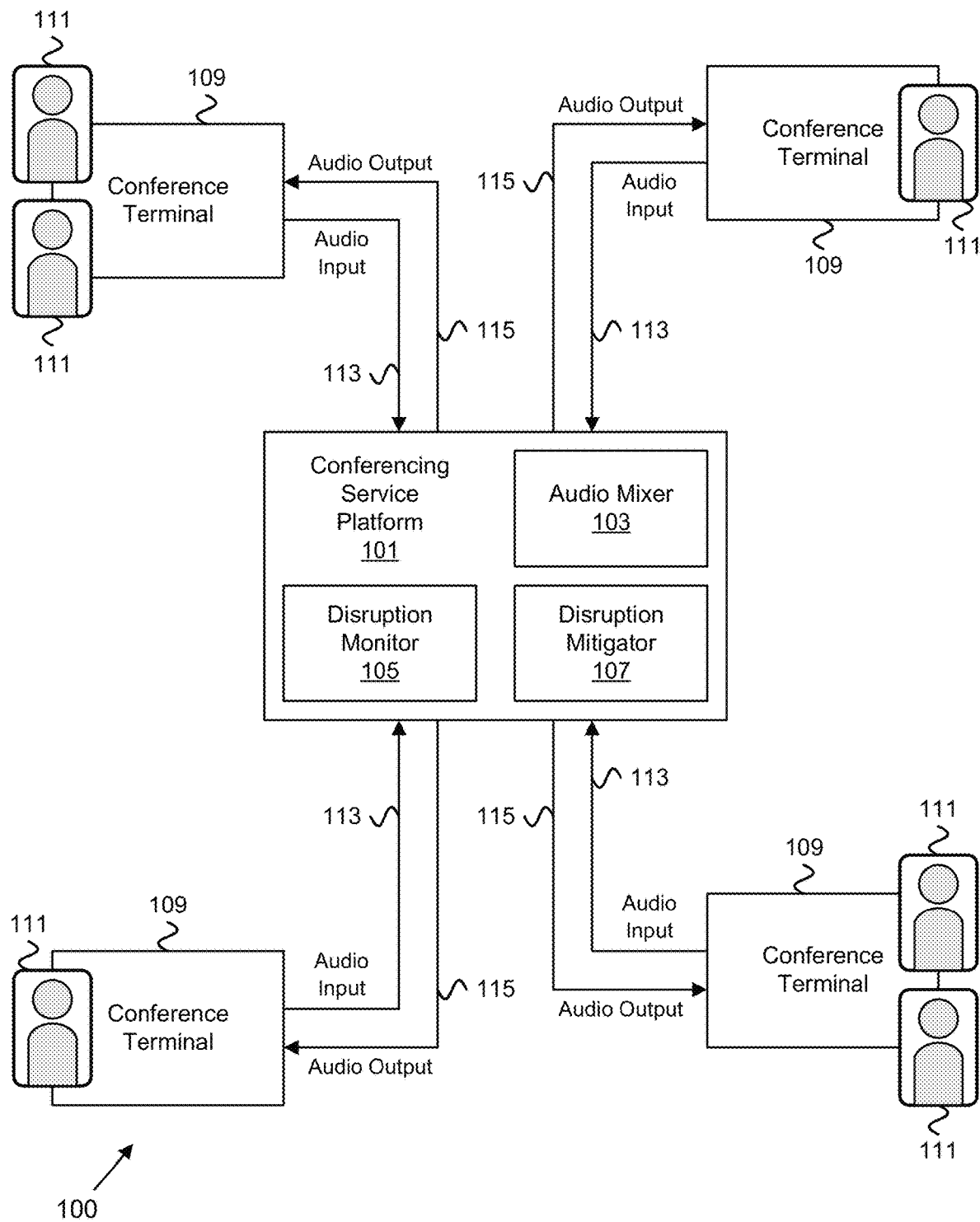
FIG. 1 is a block diagram illustrating one embodiment of a system for detecting and resolving bad audio during conferencing.

As will be appreciated by one skilled in the art, aspects of the embodiments may be embodied as a system, apparatus, method, or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a program product embodied in one or more computer readable storage devices storing machine readable code, computer readable code, and/or program code, referred hereafter as code. The storage devices are tangible, non-transitory, and/or non-transmission. The storage devices do not embody signals. In a certain embodiment, the storage devices may employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object-oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. This code may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods, and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

Invention Overview

For detecting and resolving bad audio during conferencing, methods, systems, and apparatuses are disclosed herein. Conferencing products today have limited ability to determine if audio is in a bad state for a user based on network analysis (the connection is dropping packets, the connection is slow, etc.) and mostly just tell the user to switch networks, wait until conditions improve, etc. The user with bad audio can remain quiet but then has no idea if the conditions have indeed improved. Just because the network speeds up or gets more reliable is not a surefire way to determine when bad audio has improved. This leaves the user to ask the question of other conference attendees "Is my audio better now?" over and over until things improve.

The techniques disclosed herein proactively detect bad audio of a conference call and monitor it until resolution. VoIP applications are common tools used across the enterprise to facilitate conference calls, teleconferences, etc. Examples of VoIP applications include, but are not limited to, Microsoft Lync, Skype, Google Chat, Apple FaceTime, Facebook Messenger, WeChat, WhatsApp, GoToMeeting, Zoom, WebEx, and the like.

Proactively detecting and resolving bad audio in a conference call may be implemented by a central entity, such as a conferencing server. In one embodiment, the conferencing server is configured to, e.g., automatically, switch the destination of that audio input channel on the fly in order to analyze the bad audio outside the conference call.

When a user's audio input is connected to a conference, that audio channel is connected to the main conference. That means that audio input from the user will be mixed in with the conference main audio so that everyone can hear it. This will be referred to as "Main Conference Mode." In this mode, the audio analysis tools (also referred to as "analyzers") can hook to the main conference audio channel for analysis, described in further detail below.

In a second iteration, the user's audio input channel can be removed on the conference server side from the main audio channel and sent via a secondary audio channel to a piece of software that can analyze the quality of that stream. This will be known as "Analysis Mode." This action can be taken manually by the user (e.g., offer a button stating that the user can test their audio to see if it has improved) and it can also be taken automatically based on software intelligence (e.g., analysis of user's audio on the main channel indicates conditions that make it appear as if the audio is bad, therefore the software notifies the user and automatically switches them to Analysis Mode). Switching to Analysis Mode ensures that the audio input is not heard by the main conference channel while potential analysis is being performed.

In either mode, the audio is fed into the audio analyzers. These analyzers include but are not limited to:
  Tools that analyze network-related conditions—number of dropped packets, round trip time, jitter, etc.
  Tools that analyze speech-to-text transcriptions—these tools will be unable to process parts of the audio that are garbled or incomplete (it does not matter whether this is caused by network conditions, or client side conditions such as high CPU inputting garbled audio at the client itself).
  Tools that analyze the audio signal—these tools analyze the audio itself looking for static, stutter, background noise or any other means of audio analysis available. These tools operate on the audio itself.

The user's audio is analyzed by any number of analysis tools such as the ones listed above. Here, each tool analyzes in a very different way—therefore, each tool may provide a scoring metric as to how good or how bad the audio is perceived to be. For example, if the analysis of network related conditions shows a lot of dropped packets, then the confidence score is pretty high that audio is bad. If a lot of audio skipping is noticed by an audio analysis tool, then the likelihood of having bad audio is pretty high.

Each analysis tool creates an individual score of how likely it is that the audio is bad. These values may be combined into an overall confidence score or provided individually to allow the system to make a decision about "is the audio good" or "is the audio bad."

During "Main Conference Mode," a user can be alerted that their audio is probably sounding bad to other users. When the likelihood of having bad audio is high (e.g., above a threshold value), the user with bad audio is shifted to "Analysis Mode." During "Analysis Mode," the user can send audio input via their original audio channel—but it is not heard by other participants of the conference call—and the analysis tools can be used to determine when a user's audio issues clear up. This will avoid the question of "Is my audio better now?" during a call.

Claim Summary

Disclosed herein is an apparatus for detecting and resolving bad audio during a conference call, according to embodiments of the disclosure. The apparatus includes a processor and a memory that stores code executable by the processor. The processor detects bad audio for a conference call. Here, the conference call involves a plurality of participants, with each participant corresponding to one of a plurality of input streams. The processor switches a first input stream to an analysis mode, where the bad audio corresponds to a first one of the plurality of input streams, the first input stream associated with a first participant. The processor sends a conference output channel to the first participant while in the analysis mode, the conference output channel being mixed from the plurality of input streams. Thus, the first participant remains a part of the conference call and, e.g., receives the audio output (and optionally video feed, chat messaging, etc.). Concurrently, the processor analyzes the first input stream using a plurality of audio tools while in the analysis mode and returns the first input stream to a conferencing mode in response to resolving the bad audio.

In some embodiments, the processor determines an audio score for the first input stream while in the analysis mode, said audio score determined using the plurality of audio tools. In certain embodiments, the audio score is compiled from a plurality of sub-scores, each sub-score generated by one of plurality of audio tools. In certain embodiments, the bad audio is resolved when the audio score is above a threshold value.

In some embodiments, resolving the bad audio includes performing at least one repair action for the first input stream. In certain embodiments, the repair action is selected using the audio score. In certain embodiments, the repair action includes an automatic adjustment of one or more settings, said one or more settings including: a network setting, a microphone setting, an equalizer setting, a codec setting and/or an audio filter. In certain embodiments, the repair action includes sending a prompt to the first participant to perform a manual adjustment, said manual adjustment including one or more of: adjusting a device location, adjusting a participant location, adjusting a network setting, adjusting a microphone setting, adjusting an equalizer setting, adjusting a codec setting and/or switching an input device.

In some embodiments, detecting the bad audio includes analyzing the conference output channel, wherein the conference output channel is mixed from the plurality of input streams. In some embodiments, detecting the bad audio is accomplished using automated tools. In some embodiments, returning to a conferencing mode includes sending an alert to the first participant, wherein the alert includes at least one of: a visual indicator, a text alert, and an audible indicator.

In some embodiments, switching the first input stream to an analysis mode includes isolating the first input stream from the conference call. In some embodiments, switching to the analysis mode includes adjusting a status of the first participant to show a troubleshooting status. Note that the troubleshooting status corresponds to the analysis mode described above. In one embodiment, the troubleshooting status may be hidden from other participants (e.g., visible only to the affected participant). In other embodiments, the troubleshooting status may be visible to the affected participant and to the host/organizer and/or conferencing administrator, but not visible to the rest of the participants. In some embodiments, switching to the analysis mode includes sending an alert to the first participant, wherein the alert includes at least one of: a visual indicator, a text alert, and an audible indicator. The visual indicator may be a change of on-screen color or pattern, such as a change is color scheme (or theme).

Disclosed herein is a method for detecting and resolving bad audio during a conference call, according to embodiments of the disclosure. The method includes detecting bad audio for a conference call, the conference call involving a plurality of participants, each participant corresponding to one of a plurality of input streams. The method includes switching a first input stream to an analysis mode, wherein the bad audio corresponds to a first one of the plurality of input streams, the first input stream associated with a first participant. The method includes sending a conference output channel to the first participant while in the analysis mode and concurrently analyzing the first input stream using a plurality of audio tools while in the analysis mode. Here, the conference output channel is mixed from the plurality of input streams. The method includes returning the first input stream to a conferencing mode in response to resolving the bad audio.

In some embodiments, the method further includes determining an audio score for the first input stream while in the analysis mode, said audio score determined using the plurality of audio tools. In certain embodiments, the audio score is compiled from a plurality of sub-scores, each sub-score generated by one of plurality of audio tools. In certain embodiments, the bad audio is resolved when the audio score is above a threshold value.

In some embodiments, resolving the bad audio includes performing at least one repair action for the first input stream. In certain embodiments, the repair action includes an automatic adjustment of one or more settings, said one or more settings including: a network setting, a microphone setting, an equalizer setting, a codec setting and/or an audio filter. In certain embodiments, the repair action includes sending a prompt to the first participant to perform a manual adjustment, said manual adjustment including one or more of: adjusting a device location, adjusting a participant location, adjusting a network setting, adjusting a microphone setting, adjusting an equalizer setting, adjusting a codec setting and/or switching an input device. In certain embodiments, the repair action is selected using an audio score determined using the plurality of audio tools.

In some embodiments, detecting the bad audio is accomplished using automated tools. In some embodiments, detecting the bad audio includes analyzing the conference output channel, wherein the conference output channel is mixed from the plurality of input streams. In some embodiments, switching to the analysis mode includes sending an alert to the first participant, wherein the alert includes at least one of: a visual indicator, a text alert, and an audible indicator.

In some embodiments, switching the first input stream to an analysis mode includes isolating the first input stream from the conference call. In some embodiments, switching to the analysis mode includes adjusting a status of the first participant to show a troubleshooting status. In some embodiments, returning to a conferencing mode includes sending an alert to the first participant, wherein the alert includes at least one of: a visual indicator, a text alert, and an audible indicator.

Disclosed herein is a program product for detecting and resolving bad audio during a conference call, according to embodiments of the disclosure. The program product includes a computer readable storage medium that stores code executable by a processor, the executable code including code to detect bad audio for a conference call, the conference call involving a plurality of participants, each participant corresponding to one of a plurality of input streams. The executable code includes code to switch a first input stream to an analysis mode, the bad audio corresponding to a first one of the plurality of input streams, the first input stream associated with a first participant.

The executable code includes code to send a conference output channel to the first participant while in the analysis mode, the conference output channel being mixed from the plurality of input streams. The executable code includes code to analyze the first input stream using a plurality of audio tools concurrently while in the analysis mode. The executable code includes code to return the first input stream to a conferencing mode in response to resolving the bad audio.

In some embodiments, the executable code includes code to determine an audio score for the first input stream while in the analysis mode, said audio score determined using the plurality of audio tools. In certain embodiments, the audio score is compiled from a plurality of sub-scores, each sub-score generated by one of plurality of audio tools. In certain embodiments, the bad audio is resolved when the audio score is above a threshold value.

In some embodiments, resolving the bad audio includes performing at least one repair action for the first input stream. In certain embodiments, the repair action is selected using an audio score determined using the plurality of audio tools.

Disclosed herein is a second apparatus for detecting and resolving bad audio during a conference call, according to embodiments of the disclosure. The second apparatus includes a detection module that detects bad audio for a conference call, the conference call involving a plurality of participants, each participant corresponding to one of a plurality of input streams. The second apparatus includes a switching module that switches a first input stream to an analysis mode, wherein the bad audio corresponds to a first one of the plurality of input streams, the first input stream associated with a first participant.

The second apparatus includes a conferencing module that sends a conference output channel to the first participant while in the analysis mode, the conference output channel being mixed from the plurality of input streams. The second apparatus includes an analysis module that concurrently analyzes the first input stream using a plurality of audio tools while in the analysis mode, wherein the switching module returns the first input stream to a conferencing mode in response to resolving the bad audio. At least a portion of said modules include one or more of hardware circuits, a programmable hardware device and executable code, the executable code stored on at least one non-transitory computer readable storage medium.

In some embodiments, the apparatus further includes a scoring module that determines an audio score for the first input stream while in the analysis mode, said audio score determined using the plurality of audio tools. In some embodiments, the apparatus further includes a repair module that resolves the bad audio by performing at least one repair action for the first input stream. In certain embodiments, the repair action is selected using an audio score determined using the plurality of audio tools.

[FIG. 1—Conference System]

FIG. 1 depicts a system 100 configured for detecting and resolving bad audio during a conference call, in accordance with one or more implementations. In some implementations, the system 100 may include one or more conferencing service platform(s) 101 and one or more conferencing terminals 109. Conferencing service platform(s) 101 may support a conference call—e.g., provide a conferencing service for the one or more conferencing terminal(s) 109.

Each conferencing terminal 109 is associated with at least one participant 111. The conferencing terminal 109 may produce audio and/or video input streams of a participant 111. In the depicted example, a conferencing terminal 109 may be associated with two or more participants 111. The conferencing terminals 109 output the mixed conference audio channel 115 and may optionally output one or more video streams. In one embodiment, the conferencing platform(s) 101 may send multiple output video streams, for example corresponding to the conferencing terminals 109 producing video feeds. In another embodiment, the conferencing platform(s) 101 may send a single output video stream that combines one or more of the input video feeds.

Conferencing terminal(s) 109 may be configured to communicate with one or more conferencing service platforms 101 according to a client/server architecture, a peer-to-peer architecture, and/or other architectures. Conferencing service platform(s) 101 may be configured to communicate with other remote platforms according to a client/server architecture, a peer-to-peer architecture, and/or other architectures. Users may access the system 100 via conferencing terminal(s) 109 and/or conferencing service platform(s) 101.

Conferencing service platform(s) 101 may be configured by machine-readable instructions. Said machine-readable instructions may include one or more instruction modules, including computer program modules. The conferencing service platform(s) 101 may include one or more of an audio mixer 103, a disruption monitor 105, a disruption mitigator 107, and/or other instruction modules. As used herein, the term "module" may refer to any component or set of components that perform the functionality attributed to the module. This may include one or more physical processors during execution of processor readable instructions, the processor readable instructions, circuitry, hardware, storage media, or any other components.

The audio mixer 103 may be configured to receive a plurality of audio input streams 113 and output a conference audio channel 115, the audio input streams 113 and conference audio (output) channel 115 corresponding to a conference call. Each audio input stream 113 is associated with a participant 111. The audio mixer 103 combines (i.e., mixes) the audio input streams 113 to form the conference audio (output) channel 115. While not depicted in FIG. 1, in some embodiments a conferencing terminal 109 may produce a video input stream, the video streams corresponding to the conference call. Additionally, the conference service platform(s) 101 may distribute (output) one or more video streams to the conferencing terminal(s) 109, the video streams corresponding to the conference call.

Conventional conferencing products have limited ability to determine if audio is in a bad state for a user based on network analysis (the connection is dropping packets, the connection is slow, etc.). The user with bad audio has limited ability to determine whether the conditions have indeed improved. Just because the network speeds up or gets more reliable is not a sure fire way to determine when bad audio has improved.

In various embodiments, the disruption monitor 105 checks the audio input streams 113 for disruptions, i.e., to detect bad audio in one or more audio input streams 113. In one embodiment, the disruption monitor 105 checks each audio input stream 113 individually. In another embodiment, the disruption monitor 105 checks the audio input streams 113 collectively, e.g., by monitoring the conference audio output channel 115. Upon detecting bad audio (i.e., detecting at least one audio disruption), the disruption monitor 105 may signal the disruption mitigator 107 to analyze (and optionally repair) the conference audio.

The disruption monitor 105 may be configured to identify an audio input stream 113 for each conferencing terminal 109. In various embodiments, the disruption monitor 105 identifies the participant corresponding to the bad audio. In one embodiment, the participant 111 with bad audio may currently be a presenter when the one or more audio disruptions are detected. In other embodiments, the participant 111 with bad audio may be currently be a listener when the one or more audio disruptions are detected.

In some embodiments, the disruption monitor 105 detects the bad audio using automated tools. For example, the disruption monitor may constantly and/or regularly monitor the conference audio (i.e., the audio input stream 113 and/or conference audio output channel 115) using one or more audio analysis tools. In certain embodiments, the disruption monitor 105 may inspect a particular audio input stream 113 in response to receiving a notice (i.e., manual indication) from a participant 111 and/or conferencing terminal 109.

In various embodiments, the disruption monitor 105 is configured to detect different types of disruptions. For example, some types of disruptions may be related to the quality of a network connection between the conferencing terminal 109 and the conferencing service platform 101. As another example, some types of disruptions may be related to placement of the conferencing terminal 109 and/or the relative location of the participant 111 to the conferencing terminal 109. As yet another example, some types of disruptions may be related to one or more settings of the conferencing terminal 109.

In some embodiments, different analysis tools may be used to identify the various types of audio disruptions. Moreover, different factors may affect how the disruption(s) affect the conference call. For example, connectivity issues may have a greater contribution to bad audio (i.e., greater disruption) than incorrect device settings. Thus, different types of disruptions may be weighted differently when determining an audio quality.

In certain embodiments, the audio analysis tools may be used to assign an audio quality score to the various audio input streams 113. Here, the audio quality score is a scoring metric that may be used to categorize the audio quality and/or determine whether the audio quality is bad for an audio stream. The audio quality score may take into consideration the type of disruption, a frequency of disruption, and/or other factors. In one embodiment, the disruption monitor 105 determines a first audio quality score when monitoring for disruptions. Later, the disruption mitigator 107 may determine a second audio quality score when identifying solutions to the bad audio.

The disruption mitigator 107 may be configured to analyze an audio input stream 113 for solutions to the one or more audio disruptions. Here, the conferencing service platform 101 may feed the audio input stream 113 associated with the bad audio to an audio analysis tool. In certain embodiments, the audio analysis tool(s) are a part of disruption mitigator 107. Thus, in one embodiment, the audio mixer 103 feeds the audio input stream 113 associated with the bad audio to the disruption mitigator 107. Importantly, the conferencing service platform(s) 101 continues to feed conference audio to participant associated with bad audio. Thus, the participant 111 remains a part of conference, receives audio/video output feed(s), chat, etc.

In some embodiments, the audio input stream 113 associated with the bad audio is isolated from the rest of the audio input streams 113, such that the audio mixer 103 does not add the affected audio input stream 113 into the conference audio output channel 115. In other embodiments, the audio input stream 113 associated with the bad audio may be split so that one instance of the affected audio input stream 113 is sent to the disruption mitigator 107, while a copy of the affected audio input stream 113 is mixed into the conference audio output channel 115.

Note that the decision on whether to isolate or split the audio input stream 113 associated with the bad audio may be made based on whichever option minimizes disruptions to the conference call. For example, if a participant 111 associated with the affected audio input stream 113 is a presenter at the time of the audio disruptions, then the conferencing platform(s) 101 may split the affected audio input stream 113. On the other hand, if the participant 111 associated with the affected audio input stream 113 is a not presenter at the time of the audio disruptions, then the conferencing platform(s) 101 may isolate the affected audio input stream 113.

The disruption mitigator 107 may be configured to identify and/or apply one or more solutions for mitigating the bad audio. In various embodiments, the solutions are fixes to solve the issue of bad audio at the conferencing terminal 109 associated with the bad audio. In some embodiments, the solution(s) may be selected using the scoring metrics describe above. In some embodiments, the disruption mitigator 107 applies one or more of the mitigating solutions by interacting with the affected conferencing terminal 109. For example, via a conferencing client running on the conferencing terminal 109, the disruption mitigator 107 may adjust one or more settings. In some embodiments, the disruption mitigator 107 prompts the affected participant 111 to manually perform a solution. For example, the participant 111 may be prompted to rearrange hardware of the conferencing terminal 109 (e.g., rearrange a microphone, speaker, network adapter, etc.) in order to fix the bad audio. As another example, the participant 111 may be prompted to approve adjustment of one or more parameters/settings of the conferencing terminal 109 in order to fix the bad audio.

In various embodiments, the audio analysis tools may include a network condition analyzer configured to determine current network conditions of the audio input stream 113 associated with the bad audio. In various embodiments, the audio analysis tools may include an intelligible speech analyzer configured to determine whether intelligible speech can be recognized from the audio input stream 113 associated with the bad audio. In various embodiments, the audio analysis tools may include an audio signal analyzer configured to measure various audio signal parameters of the audio input stream 113 associated with the bad audio. These audio analysis tools are described in further detail below with reference to FIG. 4.

In various embodiments, the conferencing service platform 101 may set a status of the participant 111 associated with the affected audio input stream 113 to a troubleshooting status upon the disruption monitor 105 detecting the bad audio. The participant 111 may remain in the troubleshooting status until the disruption mitigator 107 determines that the affected audio input stream has good audio (e.g., in response to performing the mitigating/repair actions). In one embodiment, the status is a presence state associated with a presence service. Here, the conferencing service platform 101 may provide the presence service, e.g., in conjunction with the conferencing services. In certain embodiments, the troubleshooting status is visible to only certain participants 111 of the conference call. For example, the troubleshooting status may be visible only to the affected participant 111 and to a host and/or organizer of the conference call. As another example, the troubleshooting status may be visible only to the affected participant 111. In other embodiments, the troubleshooting status may be visible to all participants 111 of the conference call.

In various embodiments, the conferencing service platform 101 alerts each participant 111 when their audio quality shifts from good to bad, or vice versa. In some embodiments, the alert includes a visible indicator. In one example, the visual indicator is a change of on-screen color or pattern, such as a change is color scheme (or theme). In another example, the visual indicator is the appearance of a border, pop-up notification or other alert element. In yet another example, the visual indicator is the appearance of text. In some embodiments, the alert includes an audible indicator, for example, a chime, tone, voice, or other alert sound. Note that the alert may include both a visual indicator and an audible indicator. In one embodiment, the borders of a user interface and/or window corresponding to a conferencing application client may be highlighted, or framed in a particular color to indicate the troubleshooting status (i.e., indicating the participant/client has been switched to the analysis mode, e.g., due to bad audio).

In some implementations, conference terminal(s) 109 and/or conference service platform(s) 101 may be operatively linked via one or more electronic communication links. For example, such electronic communication links may be established, at least in part, via a network such as the Internet and/or other networks. It will be appreciated that this is not intended to be limiting, and that the scope of this disclosure includes implementations in which conference terminal(s) 109 and/or conference service platform(s) 101 may be operatively linked via some other communication media.

A given conference terminal 109 may include one or more processors configured to execute computer program modules. The computer program modules may be configured to enable a participant 111 associated with the given conference terminal 109 to interface with conference service platform(s) 101 and/or provide other functionality attributed herein to conference terminal(s) 109. By way of non-limiting example, a given conference service platform 101 and/or a given conference terminal 109 may include one or more of a server, a desktop computer, a laptop computer, a handheld computer, a tablet computing platform, a NetBook, a Smartphone, a gaming console, and/or other computing platforms.

Conference service platform(s) 101 may include electronic storage, one or more processors, and/or other components. Conference service platform(s) 101 may include communication lines, or ports to enable the exchange of information with a network and/or other computing platforms. Illustration of conference service platform(s) 101 in FIG. 1 is not intended to be limiting. Conference service platform(s) 101 may include a plurality of hardware, software, and/or firmware components operating together to provide the functionality attributed herein to conference service platform(s) 101. For example, conference service platform(s) 101 may be implemented by a cloud of computing platforms operating together as conference service platform(s) 101.

The electronic storage may comprise non-transitory storage media that electronically stores information. The non-transitory storage media may include one or both of system storage that is provided integrally (i.e., substantially non-removable) with conference terminal(s) 109 and/or removable storage that is removably connectable to conference terminal(s) 109 via, for example, a port (e.g., a USB port, a firewire port, etc.) or a drive (e.g., a disk drive, etc.). Electronic storage may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage may include one or more virtual storage resources (e.g., cloud storage, a virtual private network, and/or other virtual storage resources). Electronic storage may store software algorithms, information determined by processor(s), information received from conference terminal(s) 109, information received from conference service platform(s) 101, and/or other information that enables conference terminal(s) 109 to function as described herein.

Processor(s) may be configured to provide information processing capabilities in the conference service platform(s) 101 and/or conference terminal(s) 109. As such, processor(s) may include one or more of a digital processor, an analog processor, a digital circuit designed to process information, an analog circuit designed to process information, a state machine, and/or other mechanisms for electronically processing information. In some implementations, processor(s) may include a plurality of processing units. These processing units may be physically located within the same device, or processor(s) may represent processing functionality of a plurality of devices operating in coordination. Processor(s) may be configured to execute the audio mixer 103, the disruption monitor 105, the disruption mitigator, and/or other modules. Processor(s) may be configured to execute modules by software; hardware; firmware; some combination of software, hardware, and/or firmware; and/or other mechanisms for configuring processing capabilities on processor(s).

Figure 2A:
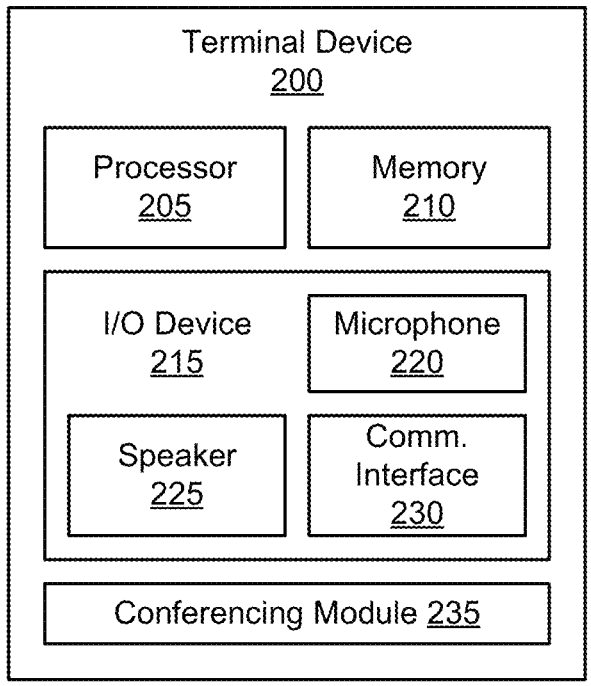
FIG. 2A is a block diagram illustrating one embodiment of an apparatus for detecting and resolving bad audio during conferencing.

[FIG. 2A—Conference Terminal]

FIG. 2A depicts a terminal device 200 for detecting and resolving bad audio during conferencing (e.g., teleconference), according to embodiments of the disclosure. The terminal device 200, may be one implementation of the conferencing terminal 109. The terminal device 200 may include a processor 205, a memory 210, an input/output ("I/O") device 215, and a conferencing module 235. As depicted, the I/O device 215 may include one or more of a microphone 220, a speaker 225, and/or communication interface 230.

The terminal device 200 may include a body or an enclosure, with the components of the terminal device 200 being located within the enclosure. In various embodiments, the terminal device 200 includes a battery or power supply for providing electrical power to the terminal device 200. Moreover, the components of the terminal device 200 are communicatively coupled to each other, for example via a computer bus.

The processor 205, in one embodiment, may comprise any known controller capable of executing computer-readable instructions and/or capable of performing logical operations. For example, the processor 205 may be a microcontroller, a microprocessor, a central processing unit ("CPU"), a graphics processing unit ("GPU"), an auxiliary processing unit, a FPGA, or similar programmable controller. In some embodiments, the processor 205 executes instructions stored in the memory 210 to perform the methods and routines described herein. The processor 205 is communicatively coupled to the memory 210, the I/O device 215, the microphone 220, the speaker 225, the communication interface 230, and the conferencing module 235.

The processor 205 may be configured to provide information processing capabilities in the terminal device 200. As such, the processor 205 may include one or more of a digital processor, an analog processor, a digital circuit designed to process information, an analog circuit designed to process information, a state machine, and/or other mechanisms for electronically processing information. Although the processor 205 is shown in FIG. 2A as a single entity, this is for illustrative purposes only. In some implementations, the processor(s) 205 may include a plurality of processing units. These processing units may be physically located within the same device, or processor(s) 205 may represent processing functionality of a plurality of devices operating in coordination. The processor(s) 205 may be configured to execute modules by software; hardware; firmware; some combination of software, hardware, and/or firmware; and/or other mechanisms for configuring processing capabilities on processor(s).

The memory 210, in one embodiment, is a computer readable storage medium. In some embodiments, the memory 210 includes volatile computer storage media. For example, the memory 210 may include a random-access memory ("RAM"), including dynamic RAM ("DRAM"), synchronous dynamic RAM ("SDRAM"), and/or static RAM ("SRAM"). In some embodiments, the memory 210 includes non-volatile computer storage media. For example, the memory 210 may include a hard disk drive, a flash memory, or any other suitable non-volatile computer storage device. In some embodiments, the memory 210 includes both volatile and non-volatile computer storage media.

In some embodiments, the memory 210 stores data relating to detecting and resolving bad audio during conferencing. For example, the memory 210 may store devices participating in the conference call, statuses and capabilities of the participating devices, and the like. In some embodiments, the memory 210 also stores program code and related data, such as an operating system operating on the terminal device 200. In one embodiment, the memory 210 stores program code for a conferencing client used to participate in the conference call.

The I/O device 215, in one embodiment, may comprise one or more of: an input portion and an output portion, and a communication interface 230. In various embodiments, the input portion may be any known computer input device including a microphone 220, a touch panel, a button, a keypad, and the like. In certain embodiments, the input portion may include a camera unit for capturing image data. In some embodiments, a user may input instructions via the camera unit using visual gestures. In some embodiments, the input portion comprises two or more different devices, such as a camera unit and a touch panel.

The microphone 220, in one embodiment, comprises at least one input sensor (e.g., microphone transducer) that converts acoustic signals (sound waves) into electrical signals, thereby receiving audio signals. In various embodiments, the user inputs sound or voice data (e.g., voice commands) via the microphone array. Here, the microphone 220 picks up sounds (e.g., speech) from one or more teleconference participants.

In various embodiments, the output portion is configured to output audible, visual, and/or haptic signals. As depicted, the output portion includes one or more speakers 225 configured to output acoustic signals. Here, the speaker 225 produces audio output, for example of conversation or other audio content of a teleconference. In some embodiments, the output portion includes an electronic display capable of outputting visual data to a user. For example, the output portion may include an LCD display, an LED display, an OLED display, a projector, or similar display device capable of outputting images, text, or the like to a user. In some embodiments, the output portion includes one or more haptic devices for producing vibrations, motion, or other haptic output.

In some embodiments, all or parts of the output portion may be integrated with the input portion. For example, the input portion and output portion may form a touchscreen or similar touch-sensitive display. As another example, the input portion and output portion may form a display that includes haptic response mechanisms. In other embodiments, one or more output units may be located near an input unit. For example, a microphone 220, a speaker 225, a camera unit, and touchscreen unit may all be located on a common surface of the terminal device 200. The output portion may receive instructions and/or data for output from the processor 205 and/or the conferencing module 235.

The communication interface 230 may include hardware circuits and/or software (e.g., drivers, modem, protocol/network stacks) to support wired or wireless communication between the terminal device 200 and another device or network. Here, the communication interface 230 is used to connect the terminal device 200 to the conference call. A wireless connection may include a mobile telephone network. The wireless connection may also employ a Wi-Fi network based on any one of the Institute of Electrical and Electronics Engineers (IEEE) 802.11 standards. Alternatively, the wireless connection may be a BLUETOOTH® connection. In addition, the wireless connection may employ a Radio Frequency Identification (RFID) communication including RFID standards established by the International Organization for Standardization (ISO), the International Electrotechnical Commission (IEC), the American Society for Testing and Materials® (ASTM®), the DASH7™ Alliance, and EPCGlobal™.

Alternatively, the wireless connection may employ a ZigBee® connection based on the IEEE 802 standard. In one embodiment, the wireless connection employs a Z-Wave® connection as designed by Sigma Designs®. Alternatively, the wireless connection may employ an ANT® and/or ANT+® connection as defined by Dynastream® Innovations Inc. of Cochrane, Canada.

The wireless connection may be an infrared connection including connections conforming at least to the Infrared Physical Layer Specification (IrPHY) as defined by the Infrared Data Association® (IrDA®). Alternatively, the wireless connection may be a cellular telephone network communication. All standards and/or connection types include the latest version and revision of the standard and/or connection type as of the filing date of this application.

The conferencing module 235, in one embodiment, is configured to support a conference call between two or more terminal devices 200. Via the microphone 220, the conferencing module 235 captures audio input of a participant and sends an audio input channel to one or more devices supporting and/or participating in the conference call. For example, the conferencing module 235 may send an audio input stream 113 to a conferencing service platform 101, as described above with reference to FIG. 1. In certain embodiments, the conferencing module 235 may also capture image data (e.g., of a participant, a screen, etc.) and send a video input channel to the one or more devices supporting and/or participating in the conference call.

Via the speaker(s) 225, the conferencing module 235 receives an audio stream that is the output of the conference call. In certain embodiments, the audio stream is received from the one or more devices supporting and/or participating in the conference call. As an example, the conferencing module 235 may receive a mixed conference audio channel 115 from the conferencing service platform 101, as described above with reference to FIG. 1.

In some embodiments, the conferencing module 235 acquires condition data of the terminal device 200, for example relating to a network condition (e.g., as experience by the communication interface 230) and/or relating to a system condition (e.g., CPU load, memory use, etc.). Here, the condition data is usable to diagnose a cause for bad audio. In such embodiments, the conferencing module 235 may provide the condition data to the one or more devices supporting and/or participating in the conference call, such as the conferencing service platform 101. In various embodiments, the conferencing module 235 may control the I/O device 215 to indicate (to the user/participant) that the participant has been switched to the analysis mode, e.g., due to bad audio. In certain embodiments, the conferencing module 235 may interact with the conferencing service platform 101 to repair the bad audio, as discussed in further detail below.

In one embodiment, the conferencing module 235 may be embodied in a software application (or set of software applications) stored in the memory 210 and operating on the terminal device 200 (e.g., running on the processor 205). In another embodiment, the conferencing module 235 may include hardware circuitry for supporting the conference call, such as microphone and/or speaker circuitry, audio signal processor, etc.

Figure 2B:
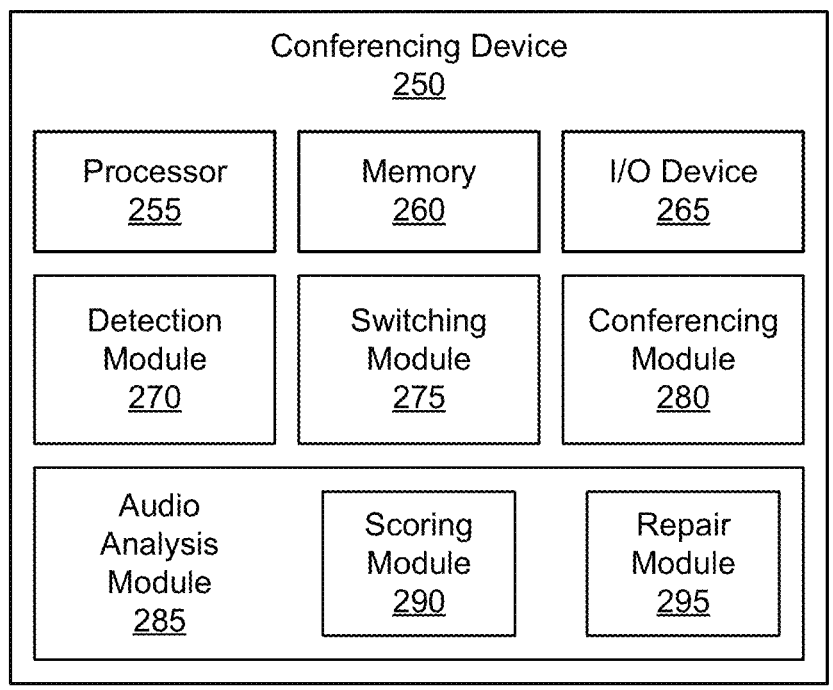
FIG. 2B is a block diagram illustrating one embodiment of an apparatus for detecting and resolving bad audio during conferencing.

[FIG. 2B—Conference Server]

FIG. 2B depicts a conferencing device 250 for detecting and resolving bad audio during conferencing, according to embodiments of the disclosure. The conferencing device 250 may be one embodiment of the conferencing service platform 101, discussed above. The conferencing device 250 may include a processor 255, a memory 260, and an input/output ("I/O") device 265. As depicted, the conferencing device 250 may include one or more of a detection module 270, a switching module 275, a conferencing module 280, an audio analysis module 285, a scoring module 290, and/or a repair module 295.

The conferencing device 250 may include a body or an enclosure, with the components of the conferencing device 250 being located within the enclosure. In various embodiments, the conferencing device 250 includes a battery or power supply for providing electrical power to the conferencing device 250. Moreover, the components of the conferencing device 250 are communicatively coupled to each other, for example via a computer bus. Alternatively, the conferencing device 250 may be a distributed apparatus with the different components/portions (in different location) being communicatively coupled to each other. Here, different components may have their own enclosures and/or power supplies.

The processor 255, in one embodiment, may comprise any known controller capable of executing computer-readable instructions and/or capable of performing logical operations. For example, the processor 255 may be a microcontroller, a microprocessor, a central processing unit ("CPU"), a graphics processing unit ("GPU"), an auxiliary processing unit, a FPGA, or similar programmable controller. In some embodiments, the processor 255 executes instructions stored in the memory 260 to perform the methods and routines described herein. The processor 255 is communicatively coupled to the memory 260, the I/O device 265, and the modules 270, 275, 280, 285, 290 and 295.

The processor 255 may be configured to provide information processing capabilities in the conferencing device 250. As such, the processor 255 may include one or more of a digital processor, an analog processor, a digital circuit designed to process information, an analog circuit designed to process information, a state machine, and/or other mechanisms for electronically processing information. Although the processor 255 is shown in FIG. 2B as a single entity, this is for illustrative purposes only. In some implementations, the processor(s) 205 may include a plurality of processing units. These processing units may be physically located within the same device, or processor(s) 205 may represent processing functionality of a plurality of devices operating in coordination. The processor(s) 205 may be configured to execute modules by software; hardware; firmware; some combination of software, hardware, and/or firmware; and/or other mechanisms for configuring processing capabilities on processor(s).

The memory 260, in one embodiment, is a computer readable storage medium. In some embodiments, the memory 260 includes volatile computer storage media. For example, the memory 260 may include a random-access memory ("RAM"), including dynamic RAM ("DRAM"), synchronous dynamic RAM ("SDRAM"), and/or static RAM ("SRAM"). In some embodiments, the memory 260 includes non-volatile computer storage media. For example, the memory 260 may include a hard disk drive, a flash memory, or any other suitable non-volatile computer storage device. In some embodiments, the memory 260 includes both volatile and non-volatile computer storage media.

In some embodiments, the memory 260 stores data relating to detecting and resolving bad audio during conferencing. For example, the memory 260 may store devices participating in the conference call, statuses and capabilities of the participating devices, and the like. In some embodiments, the memory 260 also stores program code and related data, such as an operating system operating on the conferencing device 250. In one embodiment, the memory 260 stores program code for a conferencing client used to participate in the conference call.

The I/O device 265, in one embodiment, may comprise one or more of: an input portion and an output portion, and a communication interface. In various embodiments, the input portion may be any known computer input device including a microphone, a touch panel, a button, a keypad, and the like. In certain embodiments, the input portion may include a camera unit for capturing image data. In some embodiments, a user may input instructions via the camera unit using visual gestures. In some embodiments, the input portion comprises two or more different devices, such as a camera unit and a touch panel.

In various embodiments, the output portion is configured to output audible, visual, and/or haptic signals. In some embodiments, the output portion includes one or more speakers configured to output acoustic signals. In some embodiments, the output portion includes an electronic display capable of outputting visual data to a user, as discussed above with reference to FIG. 2A. In some embodiments, the output portion includes one or more haptic devices for producing vibrations, motion, or other haptic output.

As discussed above, all or parts of the output portion may be integrated with the input portion. In other embodiments, one or more output units may be located near an input unit. The output portion may receive instructions and/or data for output from the processor 255 and/or the modules 270-295.

The communication interface may include hardware circuits and/or software (e.g., drivers, modem, protocol/network stacks) to support wired or wireless communication between the conferencing device 250 and another device or network. Here, the communication interface 230 is used to facilitate the conference call by connecting the conferencing device 250 to the participant devices (e.g., conference terminals 109 and/or terminal devices 200).

As depicted, the conferencing device 250 includes a plurality of modules. Specifically, the conferencing device 250 may include a detection module 270, a switching module 275, a conferencing module 280, and an audio analysis module 285. In certain embodiments, the conferencing device 250 may also include a scoring module 290 and/or a repair module 295. The modules 270, 275, 280, 285, 290, and/or 295 may be implemented as hardware, software, or a combination of hardware and software.

The description of the functionality provided by the different modules 270, 275, 280, 285, 290, and/or 295 described below is for illustrative purposes, and is not intended to be limiting, as any of modules 270, 275, 280, 285, 290, and/or 295 may provide more or less functionality than is described. For example, one or more of modules 270, 275, 280, 285, 290, and/or 295 may be eliminated, and some or all of its functionality may be provided by other ones of modules 270, 275, 280, 285, 290, and/or 295. As another example, the processor 255 may be configured to execute one or more additional modules that may perform some or all of the functionality attributed below to one of modules 270, 275, 280, 285, 290, and/or 295.

The detection module 270, in one embodiment, is configured to identify bad audio for a conference call, the conference call involving a plurality of participants, each participant corresponding to one of a plurality of input streams. Here, the bad audio corresponds to a first one of the plurality of input streams, the first input stream associated with a first participant.

In some embodiments, the detection module 270 detects the bad audio by analyzing the conference output channel, where the conference output channel is mixed from the plurality of input streams. In some embodiments, the detection module 270 detects the bad audio using automated tools. The detection module 270 may include one implementation of the disruption monitor 105.

In one embodiment, the detection module 270 may be embodied in a software application (or set of software applications) stored in the memory 260 and operating on the conferencing device 250 (e.g., running on the processor 255). In another embodiment, the detection module 270 may include hardware circuitry for supporting the conference call, such as microphone and/or speaker circuitry, audio signal processor, etc.

The switching module 275, in one embodiment, is configured to switch a first input stream to an analysis mode, e.g., routing the first input stream to one or more audio analysis tools. In some embodiments, the switching module 275 isolates the first input stream from the conference call when switching the first input stream to an analysis mode. Here, isolating the first input stream refers to sending the first input stream to the audio analysis module 285 and preventing the first input stream from being mixed into the conference output channel (i.e., removing the first audio from the conference mix). In one embodiment, the first input stream is muted.

In some embodiments, the switching module 275 adjusts a status of the first participant to show a troubleshooting status when switching to the analysis mode. In some embodiments, the switching module 275 sends an alert to the first participant when switching to the analysis mode. The switching module 275 may also send an alert to the first participant when returning to a conferencing mode. In various embodiments, the alert includes at least one of: a visual indicator, a text alert, and an audible indicator.

In one embodiment, the switching module 275 may be embodied in a software application (or set of software applications) stored in the memory 260 and operating on the conferencing device 250 (e.g., running on the processor 255). In another embodiment, the switching module 275 may include hardware circuitry for supporting the conference call, such as microphone and/or speaker circuitry, audio signal processor, etc.

The conferencing module 280, in one embodiment, is configured to support a conference call between two or more terminal devices 200. The conferencing module 280 may be configured to receive a plurality of audio input streams and output a conference audio channel, the audio input streams and conference output channel corresponding to the conference call. As discussed above, each audio input stream may be associated with a participant. The conferencing module 280 may implement an audio mixer that combines (i.e., mixes) the various audio input streams to form the conference output channel. As such, the conferencing module 280 may include one implementation of the audio mixer 103.

The conferencing module 280, in one embodiment, is configured to send a conference output channel to the first participant while in the analysis mode, the conference output channel being mixed from the plurality of input streams. As discussed above, the first input stream may be isolated from the conference output channel while the first participant is in the analysis mode. However, in other embodiments, the first input stream may be mixed into the conference output channel. In such embodiments, the first input stream may be modified when mixed into the output channel while in the analysis mode. For example, a volume of the first audio stream may be adjusted or an audio frequency filter may be applied to the first audio stream in order to mitigate the bad audio.

In one embodiment, the conferencing module 280 may be embodied in a software application (or set of software applications) stored in the memory 260 and operating on the conferencing device 250 (e.g., running on the processor 255). In another embodiment, the conferencing module 280 may include hardware circuitry for supporting the conference call, such as microphone and/or speaker circuitry, audio signal processor, etc.

The audio analysis module 285, in one embodiment, is configured to analyze the first input stream while in the analysis mode using a plurality of audio tools concurrently. In such embodiments, wherein the switching module 275 returns the first input stream to a conferencing mode in response to resolving the bad audio. As such, the audio analysis module 285 may include one implementation of the disruption mitigator 107.

In some embodiments, the audio analysis module 285 acquires condition data of a participant device, for example relating to a network condition (e.g., as experience by the communication interface 230) and/or relating to a system condition (e.g., CPU load, memory use, etc.) of the participant device. Here, the condition data is usable to diagnose a cause for bad audio. In one embodiment, condition data is sent regularly by the participant devices (e.g., at predefined intervals). In another embodiment, a participant device reports condition data in response to the conferencing device 250 requesting said data. In certain embodiments, the participant devices report a first set of data, while the conferencing device 250 requests a second set of data, the second set enabling better diagnosis of a participant device.

In one embodiment, the audio analysis module 285 may be embodied in a software application (or set of software applications) stored in the memory 260 and operating on the conferencing device 250 (e.g., running on the processor 255). In another embodiment, the audio analysis module 285 may include hardware circuitry for supporting the conference call, such as microphone and/or speaker circuitry, audio signal processor, etc.

In some embodiments, the conferencing device 250 includes a scoring module 290 configured to determine an audio score for the first input stream while in the analysis mode, said audio score determined using the plurality of audio tools. In certain embodiments, the audio score is compiled from a plurality of sub-scores, each sub-score generated by one of plurality of audio tools. In certain embodiments, the bad audio is resolved when the audio score is above a threshold value.

In one embodiment, the scoring module 290 may be embodied in a software application (or set of software applications) stored in the memory 260 and operating on the conferencing device 250 (e.g., running on the processor 255). In another embodiment, the scoring module 290 may include hardware circuitry for supporting the conference call, such as microphone and/or speaker circuitry, audio signal processor, etc. While depicted as a component or sub-module of the audio analysis module 285, in other embodiments the scoring module 290 is implemented as a discrete module that interacts with, but is separate from, the audio analysis module 285. In yet other embodiment, the scoring module 290 may be a part of the detection module 270.

In some embodiments, the conferencing device 250 includes a repair module 295 that resolves the bad audio by performing at least one repair action for the first input stream. In certain embodiments, the repair action is selected using an audio score determined using the plurality of audio tools. In certain embodiments, the repair action includes an automatic adjustment of one or more settings, said one or more settings including: a network setting, a microphone setting, an equalizer setting, a codec setting and/or an audio filter.

In certain embodiments, the repair action includes sending a prompt to the first participant to perform a manual adjustment, said manual adjustment including one or more of: adjusting a device location, adjusting a participant location, adjusting a network setting, adjusting a microphone setting, adjusting an equalizer setting, adjusting a codec setting and/or switching an input device.

In one embodiment, the repair module 295 may be embodied in a software application (or set of software applications) stored in the memory 260 and operating on the conferencing device 250 (e.g., running on the processor 255). In another embodiment, the repair module 295 may include hardware circuitry for supporting the conference call, such as microphone and/or speaker circuitry, audio signal processor, etc. While depicted as a component or sub-module of the audio analysis module 285, in other embodiments the repair module is implemented as a discrete module that interacts with, but is separate from, the audio analysis module 285.

[FIG. 3]

FIGS. 3-6 depict scenarios for detecting and resolving bad audio during conferencing.

Figure 3:
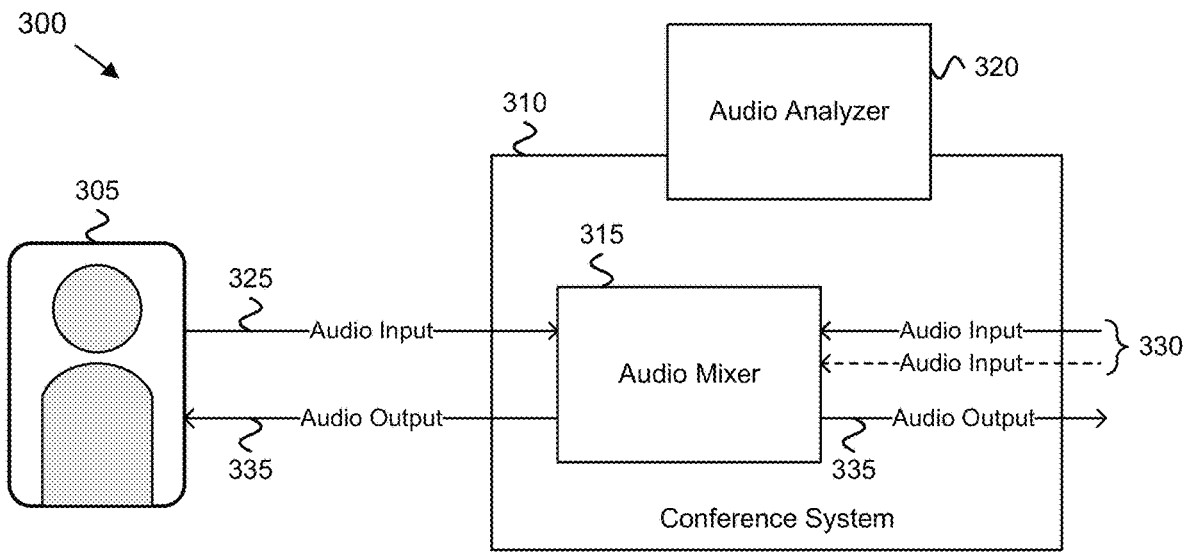
FIG. 3 is a diagram illustrating a first scenario of detecting and resolving bad audio during conferencing.

FIG. 3 depicts a first scenario 300 of detecting and resolving bad audio during conferencing, according to embodiments of the disclosure. Here, the first scenario 300 corresponds to a first time frame at which a conference call involving the participant 305 is ongoing. Here, it is assumed that the participant uses a participant device (e.g., a conference terminal 109 and/or terminal device 200) to connect to a conference call that is supported and/or hosted by the conference system 310.

The conference system 310 may be one implementation of the conferencing service platform 101 and/or conferencing device 250. As depicted, the conference system 310 includes an audio mixer 315 and an audio analyzer 320. The audio mixer 315 may be one embodiment of the audio mixer 103 and/or the conferencing module 280. The audio analyzer 320 may be one embodiment of the disruption mitigator 107 and/or the audio analysis module 285.

In the first scenario 300, the participant 305 produces an audio input channel 325 which is received by the audio mixer 315. Note that the audio mixer 315 also receives one or more additional audio input channels 330, e.g., from one or more additional conference participants. The audio mixer 315 combines the various audio input channels 325-330 into an audio output channel 335.

The conference system 310 proactively monitors the conference call for audio disruptions, i.e., for bad audio produced by a conference participant. During the first scenario 300, the participant 305 is in the main conferencing mode due to having good audio. Thus, the audio input channel 325 is mixed into the audio output channel 335.

[FIG. 4]

Figure 4:
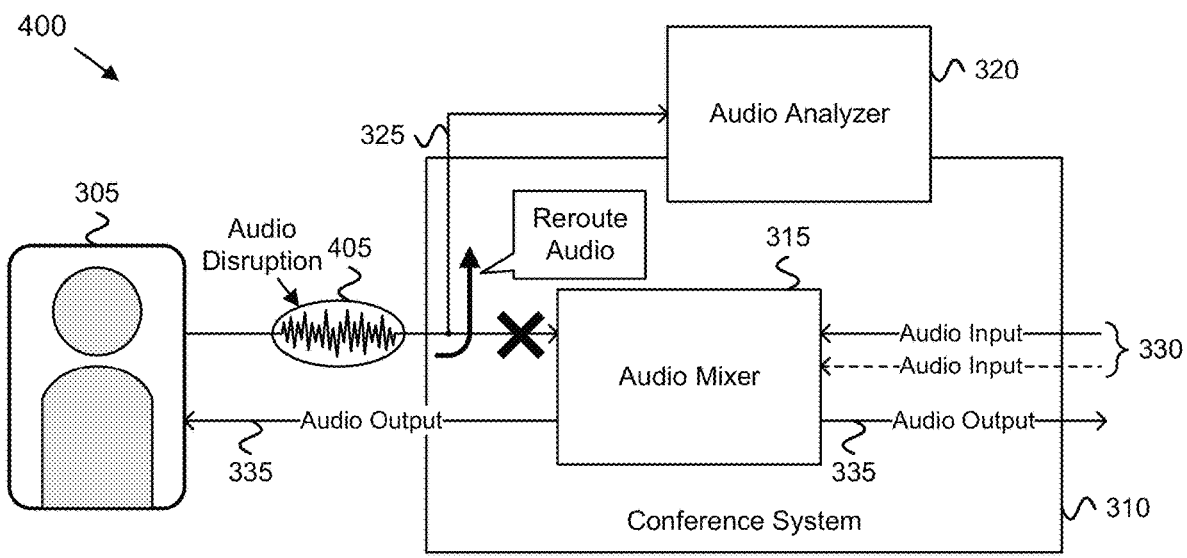
FIG. 4 is a diagram illustrating a second scenario of detecting and resolving bad audio during conferencing.

FIG. 4 depicts a second scenario 400 of detecting and resolving bad audio during conferencing, according to embodiments of the disclosure. Here, the second scenario 400 corresponds to a second time frame after the first time frame corresponding to FIG. 3. In the second scenario 400, the participant 305 has a change in conditions resulting in the audio input channel 325 having one or more audio disruptions 405. Due to the audio disruption(s) 405, the conference system determines that the participant 305 has bad audio and switches the participant 305 to the analysis mode.

In one embodiment, switching to the analysis mode includes the conference system 310 rerouting the audio input channel 325 to the audio analyzer 320. Note that in the second scenario 400 the audio input channel 325 is not provided to the audio mixer 315 and thus is not mixed into the audio output channel 335. Here, however, it is assumed that the one or more additional audio input channels 330 are not experiencing audio disruptions (i.e., still have good audio) and thus are still mixed into the audio output channel 335.

While FIGS. 3-4 depict the same audio output channel 335 being send to each conference participant, in other embodiments a personalized audio output channel may be sent to the conference participants. Here, a conference participant's personalized audio output channel may exclude the participant's own audio input channel from the mixed conference output. In such embodiments, the audio input channel 325 belonging to the participant 305 who is experiencing bad audio is not mixed into the personalized audio output channels of the other conference participants.

In various embodiments, the participant 305 is notified by the conference system 310 of the switch to the analysis mode. As described above, an alert or notification may be sent to the participant 305 informing of the analysis mode. While in the analysis mode, the audio input channel 325 is routed to the audio analyzer 320 which analyzes the input using one or more analysis tools. The analysis tools allow the conference system 310 to assess the audio quality, as described in greater detail below.

[FIG. 5]

Figure 5:
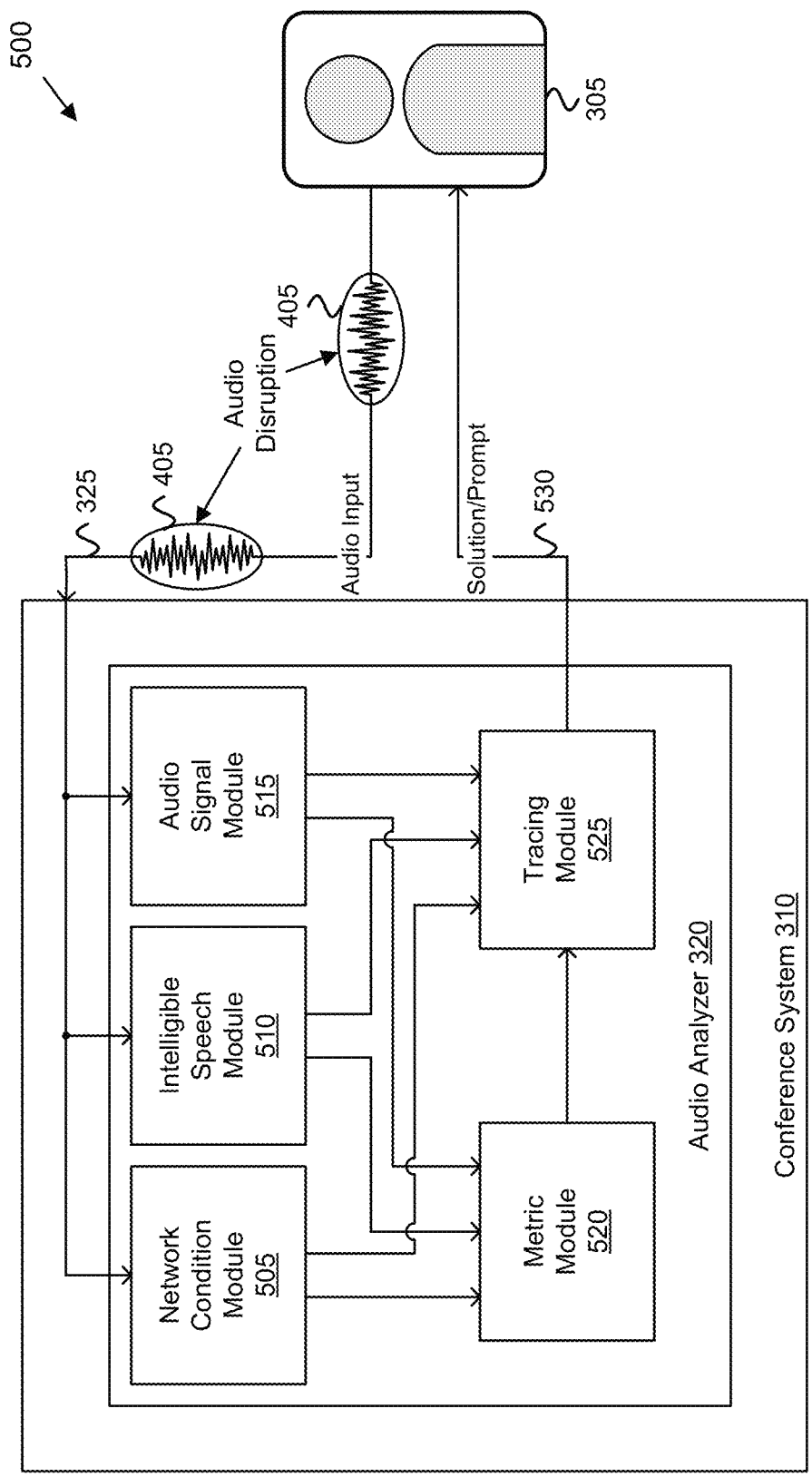
FIG. 5 is a diagram illustrating a third scenario of detecting and resolving bad audio during conferencing showing a plurality of audio analysis tools.

FIG. 5 depicts a third scenario 500 of detecting and resolving bad audio during conferencing, according to embodiments of the disclosure. Here, the third scenario 500 corresponds to a third time during which the participant 305 is in the analysis mode. Note that the participant 305 is experiencing one or more audio disruptions 405 and thus is placed in the analysis mode, e.g., as described above with reference to FIG. 4.

As depicted in FIG. 5, the audio analyzer 320 may include a plurality of modules. Specifically, the conferencing device 250 may include a network condition module 505, an intelligible speech module 510, and an audio signal module 515. In certain embodiments, the audio analyzer 320 may also include a metric module 520 and/or a tracing module 525. The modules 505, 510, 515, 520, and/or 525 may be implemented as hardware, software, or a combination of hardware and software.

The description of the functionality provided by the different modules 505, 510, 515, 520, and/or 525 described below is for illustrative purposes, and is not intended to be limiting, as any of modules 505, 510, 515, 520, and/or 525 may provide more or less functionality than is described. For example, one or more of modules 505, 510, 515, 520, and/or 525 may be eliminated, and some or all of its functionality may be provided by other ones of modules 505, 510, 515, 520, and/or 525. As another example, a processor may be configured to execute one or more additional modules that may perform some or all of the functionality attributed below to one of modules 505, 510, 515, 520, and/or 525.

While in the analysis mode, the audio input channel 325 is analyzed by the audio analyzer 320 using a plurality of audio tools. The analysis tools include, but are not limited to, a network condition module 505, an intelligible speech module 510, and an audio signal module 515. In various embodiments, the network condition module 505, the intelligible speech module 510, and audio signal module 515 may each include one or more audio analysis tools.

The network condition module 505 is representative of a class of tools that analyze network-related conditions, for example, the number of dropped packets, the round trip time, jitter, etc. In certain embodiments, the network condition module monitors and/or requests statistics concerning a network connection of the participant 305 to the conference system 310. The network condition module 505 may assess a network score based on the measures/monitored network conditions. The audio analyzer 320 uses network score the to calculate a quality of the audio input channel 325 and, in certain embodiments, may use the network score to mitigate the audio disruptions 405, as described below.

The intelligible speech module 510 is representative of a class of tools that analyze speech-to-text transcriptions of the audio input channel 325. Here, the intelligible speech module 510 uses one or more speech-to-text engines to convert speech into text. The intelligible speech module 510 may track a number of audio segments that cannot be translated into text, e.g., due to being garbled or incomplete speech. Additionally, the intelligible speech module 510 may use one or more natural language analyzers to determine if the speech-to-text transcription is intelligible, e.g., indicative of whether the text is an accurate transcription of the speech.

Note that the intelligible speech module 510 is not concerned with a source of speech-to-text errors (i.e., whether caused by network conditions, client-side conditions, etc.), only that such error are present. The intelligible speech module 510 may assess a speech score based on the measures/monitored network conditions. The audio analyzer 320 uses speech score the to calculate a quality of the audio input channel 325 and, in certain embodiments, may use the speech score to mitigate the audio disruptions 405, as described below.

The audio signal module 515 is representative of a class of tools that analyze the audio signal itself, e.g., looking for static, stutter, background noise or other evidence of audio disruptions 405. The audio signal module 515 may assess a signal score based on the measures/monitored network conditions. The audio analyzer 320 uses signal score the to calculate a quality of the audio input channel 325 and, in certain embodiments, may use the signal score to mitigate the audio disruptions 405, as described below.

Each tool analyzes in a very different way—therefore, each tool may provide a scoring metric as to how good or how bad the audio is perceived to be. For example, if the analysis of network related conditions shows a lot of dropped packets, then the confidence score is pretty high that audio is bad. If a lot of audio skipping is noticed by an audio analysis tool, then the likelihood of having bad audio is pretty high.

The metric module 520 combines the scores allowing the conference system 310 to decide whether audio of the audio input channel 325 can be considered as "good" or whether the audio can be considered as "bad." Each analysis tool creates an individual score of how likely it is that the audio is bad. In one embodiment, the network condition module 505, the intelligible speech module 510, and audio signal module 515 may each combine various sub-scores to provide a network score, speech score, and signal score, respectively, to the metric module 520. In other embodiments, the modules 505, 510 and 515 each provide a plurality of scores generated by individual tests and/or tools.

The metric module 520 may compile these values into an overall audio score. In one embodiment, the metric module 520 assigns different weights to the different scores/values. For example, analysis of more recent measurements and/or samples may be given greater weight than older measurements/samples. As another example, certain types of errors and/or anomalies may be given greater weight than others. In one embodiment, the network scores generated by the network condition module 505 may be given greater weight than speech scores and/or signal scores. In another embodiment, the speech scores generated by the intelligible speech module 510 may be given greater weight than network scores and/or signal scores. In other embodiments, the signal scores generated by the audio signal module 515 may be given greater weight than network scores and/or speech scores.

The tracing module 525 is configured to trace the audio disruption(s) to one or more causes. Moreover, the tracing module 525 may generate one or more repair actions to the bad audio and interact with the participant 305 to resolve the bad audio. In certain embodiments, the repair action is selected using the audio score. The output from the tracing module 525 to the participant 305 is depicted as "solution/prompt" 530 and represents one or more solutions and/or one or more prompts.

In some embodiments, the generated solutions may be automated solutions that the conference system 310 can implement autonomously and automatically. In other embodiments, the generated solutions may be manual solutions that the participant 305 must implement to resolve the bad audio. Here, the tracing module 525 may send one or more prompts to the participant 305.

As used herein, a "solution" sent from the conference system 310 (i.e., tracing module 525) to the participant 305 refers to a repair action that can be implemented automatically by the conference system 310 and/or a conferencing client of the participant 305 to mitigate the bad audio. As such, a "solution" can be implemented without action by or interaction with the participant 305. In contrast, a "prompt" sent from the conference system 310 (i.e., tracing module 525) to the participant 305, as used herein, refers to a repair action that requires user interaction (i.e., manual performance) to be implemented by the participant 305 to mitigate the bad audio.

Note that in some situations device/user permissions may prevent a "solution" from being automatically implemented, thus resulting in a "prompt" for an equivalent repair action. Examples of automated solutions include, but are not limited to, an automatic adjustment to one or more of: a network setting, a microphone setting, an equalizer setting, a codec setting and/or an audio filter. Examples of prompts requiring user implementation include, but are not limited to, a manual adjustment to one or more of: a device location, a participant location, a network setting, a microphone setting, an equalizer setting, a codec setting and/or an input device used to capture audio.

Upon the conference system 310 and/or participant 305 implementing the one or more solutions/prompts 530, the analysis tools 505-515 may continue to monitor the audio quality of the audio input channel 325. In some embodiments, once the metric module 520 determines that the overall confidence score has improved beyond a threshold amount, the audio analyzer 320 informs the conference system 310 that the bad audio has been resolved and the conference system 310 switches the participant 305 out of the analysis mode and back to the main conferencing mode.

While FIG. 5 shows a single participant 305 in the analysis mode, in other embodiments any number of conference participants may be in the analysis mode at the same time. Thus, the conference system 310 may include multiple instances of the audio analyzer 320 and/or of the modules 505, 510, 515, 520, and/or 525.

[FIG. 6]

Figure 6:
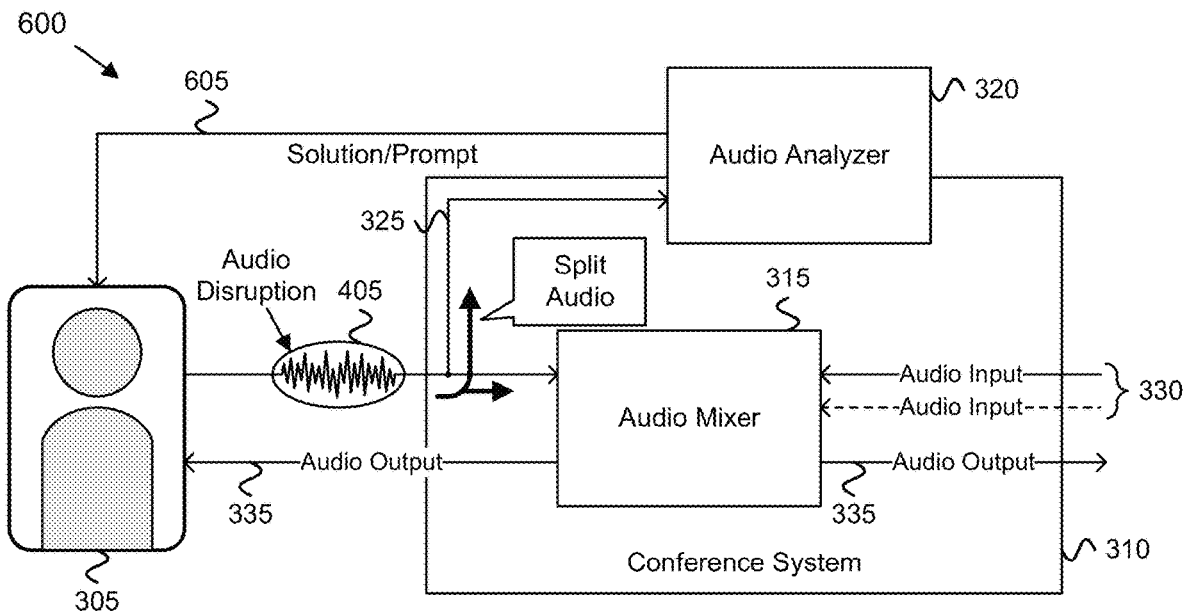
FIG. 6 is a diagram illustrating a fourth scenario of detecting and resolving bad audio during conferencing.

FIG. 6 depicts a first scenario 300 of detecting and resolving bad audio during conferencing, according to embodiments of the disclosure. Here, the fourth scenario 600 corresponds to an alternative embodiment of the second time frame discussed above with reference to FIG. 4. In the fourth scenario 600, the participant 305 has a change in conditions resulting in the audio input channel 325 having one or more audio disruptions 405. Due to the audio disruption(s) 405, the conference system determines that the participant 305 has bad audio and switches the participant 305 to the analysis mode.

In the depicted embodiment, switching to the analysis mode includes the conference system 310 splitting the audio input channel 325. One stream is sent to the audio analyzer 320, while a second stream of the audio input channel 325 is provided to the audio mixer 315. As such, the audio input channel 325 experiencing bad audio may be mixed into the audio output channel 335. Note, however, that one or more filters may be applied to the audio input channel 325 to minimize the audio disruptions 405.

The fourth scenario allows the audio input channel 325 to stay part of the mixed conference audio output channel 335 while the participant 305 is in the analysis mode. The fourth scenario 600 may be useful for situations where the participant 305 is a presenter for the conference call. In various embodiments, the participant 305 is notified by the conference system 310 of the switch to the analysis mode, e.g., by sending an alert or notification may be sent to the participant 305.

The audio analyzer 320 may generate one or more repair actions to the bad audio and send one or more solutions/prompts 605 to participant 305 to resolve the bad audio.

Upon the conference system 310 and/or participant 305 implementing the one or more solutions/prompts 605, the audio analyzer 320 may continue to monitor the audio quality of the audio input channel 325. When the audio analyzer 320 determines that the bad audio has been resolved, the conference system 310 switches the participant 305 out of the analysis mode and back to the main conferencing mode.

Figure 7:
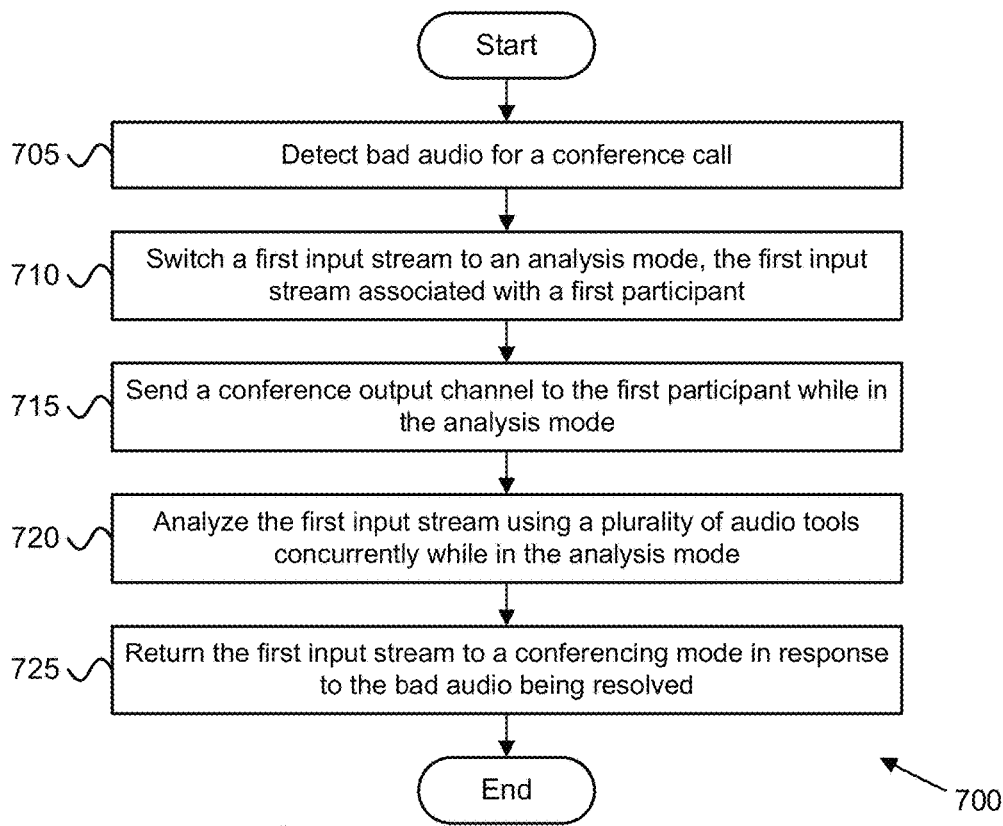
FIG. 7 is a flowchart diagram illustrating one embodiment of a method for detecting and resolving bad audio during conferencing.

[FIG. 7—Main Method]

FIG. 7 depicts a flowchart of a method 700 for resolving bad audio during conferencing, according to embodiments of the disclosure. In some embodiments, the method 700 is performed by conferencing service platform 101, the conferencing device 250, and/or the conference system 310, described above. In some embodiments, the method 700 is performed by a processor, such as a microcontroller, a microprocessor, a CPU, a GPU, an auxiliary processing unit, a FPGA, or the like The method 700 begins and detects 705 bad audio for a conference call. Here, the conference call may involve a plurality of participants, where each participant corresponds to one of a plurality of input streams. The method 700 includes switching 710 a first input stream to an analysis mode, where the first input stream is associated with a first participant. Here, the bad audio corresponds to a first one of the plurality of input streams.

The method 700 includes sending 715 a conference output channel to the first participant while in the analysis mode. Here, the conference output channel is mixed from the plurality of input streams. Note that the first input stream is not included in the conference output channel while in the analysis mode. The method 700 includes concurrently analyzing 720 the first input stream using a plurality of audio tools while in the analysis mode. The method includes returning 725 the first input stream to a conferencing mode in response to the bad audio being resolved. The method 700 ends.

Figure 8:
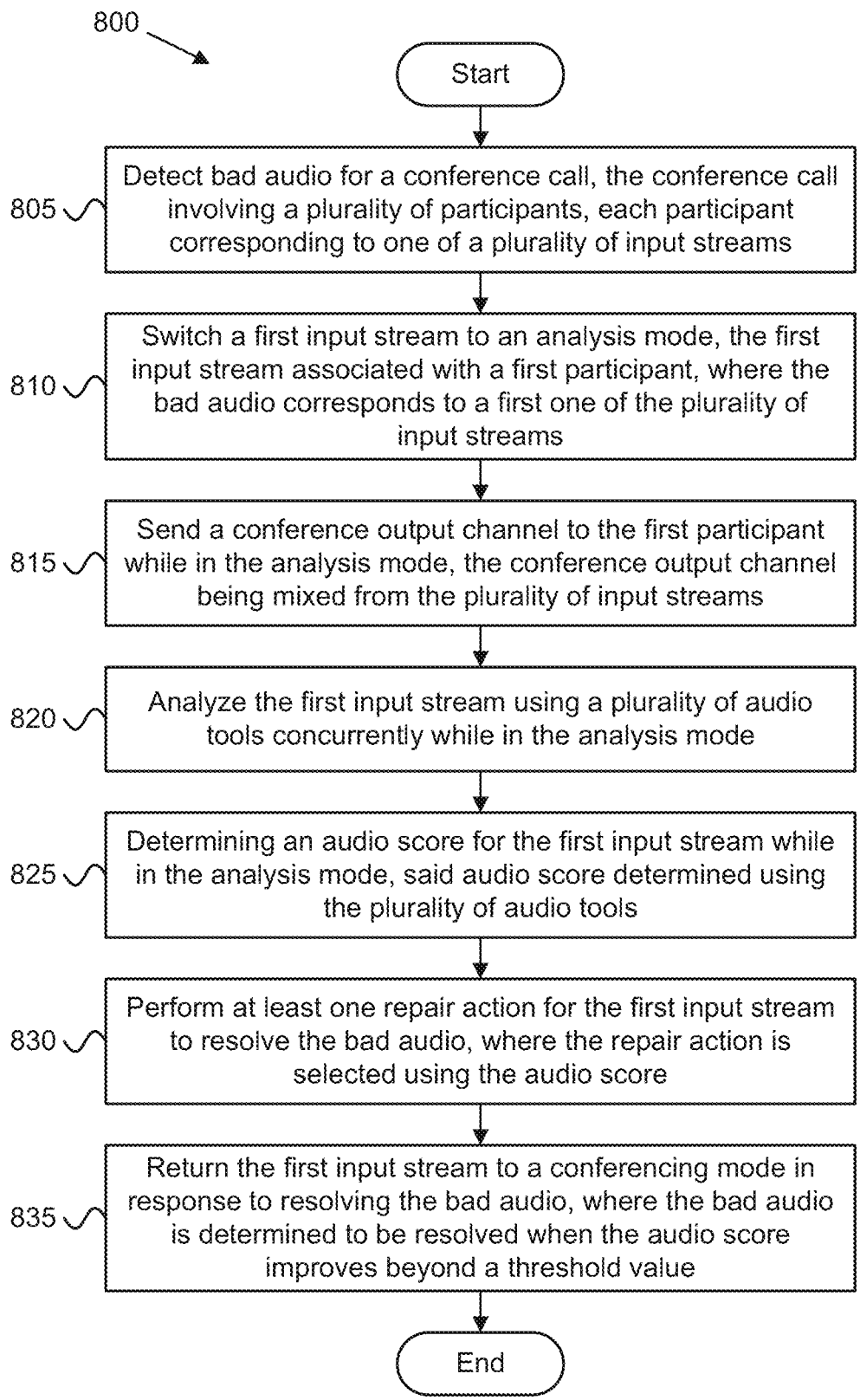
FIG. 8 is a flowchart diagram illustrating another embodiment of a method for detecting and resolving bad audio during conferencing.

[FIG. 8—Supplemental Method]

FIG. 8 depicts a flowchart of a method 800 for resolving bad audio during conferencing, according to embodiments of the disclosure. In some embodiments, the method 800 is performed by the conferencing service platform 101, the conferencing device 250, and/or the conference system 310, described above. In some embodiments, the method 800 is performed by a processor, such as a microcontroller, a microprocessor, a central processing unit (CPU), a graphics processing unit (GPU), an auxiliary processing unit, a FPGA, or the like.

The method 800 begins and detects 805 bad audio for a conference call. Here, the conference call may involve a plurality of participants, where each participant corresponds to one of a plurality of input streams. The method 800 includes switching 810 a first input stream to an analysis mode, where the first input stream is associated with a first participant. Here, the bad audio corresponds to a first one of the plurality of input streams.

The method 800 includes sending 815 a conference output channel to the first participant while in the analysis mode. Here, the conference output channel is mixed from the plurality of input streams; however, the first input stream is not included in the conference output channel while in the analysis mode.

The method 800 includes analyzing 820 the first input stream using a plurality of audio tools concurrently while in the analysis mode. The method 800 includes determining

825 an audio score for the first input stream while in the analysis mode, said audio score determined using the plurality of audio tools.

The method 800 includes performing 830 at least one repair action for the first input stream to resolve the bad audio. Here, the repair action is selected using the audio score. The method includes returning 835 the first input stream to a conferencing mode in response to the bad audio being resolved. Here, the bad audio is determined to be resolved when the audio score improves beyond a threshold value. The method 800 ends.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
    a processor; and
    a memory that stores code executable by the processor to:
    provide a first conference output channel for a conference call, the conference call involving a plurality of participants, each participant corresponding to one of a plurality of input streams, wherein the first conference output channel is mixed from the plurality of input streams and comprises an audio component from each of the plurality of input streams;
    analyze the first conference output channel to detect bad audio for the conference call;
    determine a channel source of the bad audio, wherein the bad audio corresponds to a first input stream of the plurality of input streams;
    switch the first input stream to an analysis mode, wherein the first input stream is isolated from the conference call while in the analysis mode, and wherein the first input stream is sent to a plurality of audio analysis tools while in the analysis mode, the first input stream associated with a first participant;
    send a second conference output channel to the first participant while in the analysis mode, the second conference output channel being mixed from the plurality of input streams, wherein the second conference output channel does not include the first input stream while in the analysis mode;
    perform concurrent analysis of the first input stream using the plurality of audio analysis tools while in the analysis mode, wherein the plurality of audio analysis tools includes at least one speech-to-text tool for converting speech of the first input stream into a text transcription;
    determine an audio quality of the first input stream based at least in part on the text transcription;
    perform at least one repair action for resolving the bad audio of the first input stream to create a repaired first input stream, wherein the at least one repair action comprises an automatic adjustment of one or more settings comprising: a network setting, a microphone setting, an equalizer setting, a codec setting and/or an audio filter; and
    return the first input stream to a conferencing mode in response to resolving the bad audio, wherein the conference output channel includes the repaired first input stream while in the conferencing mode to the first conference output channel.

2. The apparatus of claim 1, wherein the processor determines an audio score for the first input stream while in the analysis mode, said audio score determined using the plurality of audio tools, wherein the bad audio is resolved when the audio score is above a threshold value.

3. The apparatus of claim 2, wherein the audio score is compiled from a plurality of sub-scores, each sub-score generated by one of plurality of audio tools.

4. The apparatus of claim 1, wherein the at least one repair action is selected using an audio score determined using the plurality of audio tools.

5. The apparatus of claim 1, wherein the at least one repair action further comprises sending a prompt to the first participant to perform a manual adjustment, said manual adjustment comprising one or more of: adjusting a device location, adjusting a participant location, adjusting a network setting, adjusting a microphone setting, adjusting an equalizer setting, adjusting a codec setting and/or switching an input device.

6. The apparatus of claim 1, wherein detecting the bad audio comprises analyzing the first conference output channel, wherein detecting the bad audio is accomplished automatically using at least one of the plurality of audio tools.

7. The apparatus of claim 1, wherein switching to the analysis mode comprises adjusting a status of the first participant to show a troubleshooting status.

8. The apparatus of claim 1, wherein switching to the analysis mode comprises sending an alert to the first participant, wherein the alert comprises at least one of: a visual indicator, a text alert, and an audible indicator.

9. The apparatus of claim 1, wherein returning to a conferencing mode comprises sending an alert to the first participant, wherein the alert comprises at least one of: a visual indicator, a text alert, and an audible indicator.

10. A method of a conference call system, the method comprising:
    detecting bad audio for a conference call, the conference call involving a plurality of participants, each participant corresponding to one of a plurality of input streams, wherein a first conference output channel is mixed from the plurality of input streams and comprises an audio component from each of the plurality of input streams;
    analyze the first conference output channel for bad audio, wherein the bad audio corresponds to a first input stream of the plurality of input streams;
    switching the first input stream to an analysis mode, wherein the first input stream is isolated from the first conference output channel while in the analysis mode, and wherein the first input stream is sent to a plurality of audio analysis tools while in the analysis mode, the first input stream associated with a first participant;
    sending a second conference output channel to the first participant while in the analysis mode, the second conference output channel being mixed from the plurality of input streams, wherein the second conference output channel does not include the first input stream while in the analysis mode;
    performing concurrent analysis of the first input stream using the plurality of audio analysis tools while in the analysis mode, wherein the plurality of audio analysis tools includes at least one speech-to-text tool for converting speech of the first input stream into a text transcription;
    determining an audio quality of the first input stream based at least in part on the text transcription;
    performing at least one repair action for resolving the bad audio of the first input stream to create a repaired first input stream, wherein the at least one repair action comprises an automatic adjustment of one or more settings comprising: a network setting, a microphone setting, an equalizer setting, a codec setting and/or an audio filter; and returning the first input stream to a conferencing mode in response to resolving the bad audio, wherein the conference output channel includes the repaired first input stream while in the conferencing mode to the first conference output channel.

11. The method of claim 10, further comprising determining an audio score for the first input stream while in the analysis mode, said audio score determined using the plurality of audio tools, wherein the bad audio is resolved when the audio score is above a threshold value.

12. The method of claim 10, wherein the at least one repair action is selected using an audio score determined using the plurality of audio tools.

13. The method of claim 10, wherein detecting the bad audio comprises analyzing the first conference output channel, wherein detecting the bad audio is accomplished automatically using at least one of the plurality of audio tools.

14. A program product comprising a computer readable storage medium that stores code executable by a processor, the executable code comprising code to:

detect bad audio for a conference call, the conference call involving a plurality of participants, each participant corresponding to one of a plurality of input streams, wherein a first conference output channel is mixed from the plurality of input streams and comprises an audio component from each of the plurality of input streams;

analyze the first conference output channel for bad audio, wherein the bad audio corresponds to a first input stream of the plurality of input streams;

detect a channel source of bad audio of the first conference output channel, wherein the bad audio corresponds to a first input stream of the plurality of input streams;

switch the first input stream to an analysis mode, wherein the first input stream is isolated from the first conference output channel while in the analysis mode, and wherein the first input stream is sent to a plurality of audio analysis tools while in the analysis mode, the first input stream associated with a first participant;

send a second conference output channel to the first participant while in the analysis mode, the second conference output channel being mixed from the plurality of input streams, wherein the second conference output channel does not include the first input stream while in the analysis mode;

perform concurrent analysis of the first input stream using the plurality of audio analysis tools while in the analysis mode, wherein the plurality of audio analysis tools includes at least one speech-to-text tool for converting speech of the first input stream into a text transcription;

determine an audio quality of the first input stream based at least in part on the text transcription;

perform at least one repair action for resolving the bad audio of the first input stream to create a repaired first input stream, wherein the at least one repair action comprises an automatic adjustment of one or more settings comprising: a network setting, a microphone setting, an equalizer setting, a codec setting and/or an audio filter; and return the first input stream to a conferencing mode in response to resolving the bad audio, wherein the conference output channel includes the repaired first input stream while in the conferencing mode to the first conference output channel.

15. The program product of claim 14, wherein the executable code comprises code to determine an audio score for the first input stream while in the analysis mode, said audio score determined using the plurality of audio tools, wherein the bad audio is resolved when the audio score is above a threshold value.

16. The program product of claim 14, wherein the at least one repair action is selected using an audio score determined using the plurality of audio tools.

17. The method of claim 11, wherein the audio score is compiled from a plurality of subs-scores, each sub-score generated by one of plurality of audio tools.

18. The method of claim 10, wherein the at least one repair action comprises sending a prompt to the first participant to perform a manual adjustment, said manual adjustment comprising one or more of: adjusting a device location, adjusting a participant location, adjusting a network setting, adjusting a microphone setting, adjusting an equalizer setting, adjusting a codec setting and/or switching an input device.

19. The method of claim 10, wherein switching to the analysis mode comprises adjusting a status of the first participant to show a troubleshooting status.

20. The method of claim 10, wherein switching to the analysis mode comprises sending an alert to the first participant, wherein the alert comprises at least one of: a visual indicator, a text alert, and an audible indicator.

* * * * *